United States Patent
Krishnan et al.

(10) Patent No.: US 7,212,023 B2
(45) Date of Patent: May 1, 2007

(54) SYSTEM AND METHOD FOR ACCURATE NEGATIVE BIAS TEMPERATURE INSTABILITY CHARACTERIZATION

(75) Inventors: Anand T. Krishnan, Farmers Branch, TX (US); Srikanth Krishnan, Richardson, TX (US); Vijay Reddy, Plano, TX (US); Cathy Chancellor, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/935,375

(22) Filed: Sep. 7, 2004

(65) Prior Publication Data

US 2006/0049842 A1 Mar. 9, 2006

(51) Int. Cl.
*G01R 31/26* (2006.01)
(52) U.S. Cl. .................... 324/769; 324/158.1
(58) Field of Classification Search ............. None
See application file for complete search history.

(56) References Cited

U.S. PATENT DOCUMENTS

| | | | | |
|---|---|---|---|---|
| 4,044,373 A * | 8/1977 | Nomiya et al. | ............. | 257/356 |
| 4,086,642 A * | 4/1978 | Yoshida et al. | ............. | 361/91.5 |
| 4,574,208 A * | 3/1986 | Lade et al. | ................. | 327/389 |
| 4,691,129 A * | 9/1987 | Einzinger et al. | ........... | 327/434 |
| 4,785,207 A * | 11/1988 | Eng | ............................ | 327/541 |
| 4,931,844 A * | 6/1990 | Zommer | ........................ | 257/48 |
| 5,063,307 A * | 11/1991 | Zommer | ...................... | 327/512 |
| 5,999,011 A * | 12/1999 | Chu et al. | .................... | 324/769 |
| 6,049,213 A * | 4/2000 | Abadeer | ...................... | 324/719 |
| 6,456,104 B1 * | 9/2002 | Guarin et al. | ............... | 324/769 |
| 6,476,632 B1 * | 11/2002 | La Rosa et al. | ............ | 324/769 |
| 6,489,799 B1 * | 12/2002 | Murakami | .................. | 324/765 |
| 6,521,469 B1 * | 2/2003 | La Rosa et al. | ............. | 438/17 |
| 6,530,064 B1 | 3/2003 | Vasanth et al. | | |
| 6,653,856 B1 | 11/2003 | Liu | | |
| 6,727,710 B1 | 4/2004 | De Jong et al. | | |
| 6,801,033 B2 * | 10/2004 | Sudo et al. | .............. | 324/158.1 |
| 6,815,970 B2 * | 11/2004 | Rost et al. | .................. | 324/765 |
| 2003/0231028 A1 | 12/2003 | Liu | | |
| 2003/0233624 A1 * | 12/2003 | Reddy et al. | .................. | 716/4 |
| 2005/0156605 A1 * | 7/2005 | Lee | .............................. | 324/537 |

* cited by examiner

*Primary Examiner*—Paresh Patel
(74) *Attorney, Agent, or Firm*—Rose Alyssa Keagy; W. James Brady; Frederick J. Telecky, Jr.

(57) ABSTRACT

Methods and systems are provided for characterizing the negative temperature bias instability of a transistor. A bias voltage is maintained at a drain terminal of the transistor during a test period. A stress voltage is maintained at a gate terminal of the transistor during the test period, such that the stress voltage is applied concurrently with the bias voltage. At least one characteristic of the transistor is measured at periodic intervals during the stress period to determine a degradation of the at least one characteristic caused by the stress voltage until a termination event occurs.

8 Claims, 3 Drawing Sheets

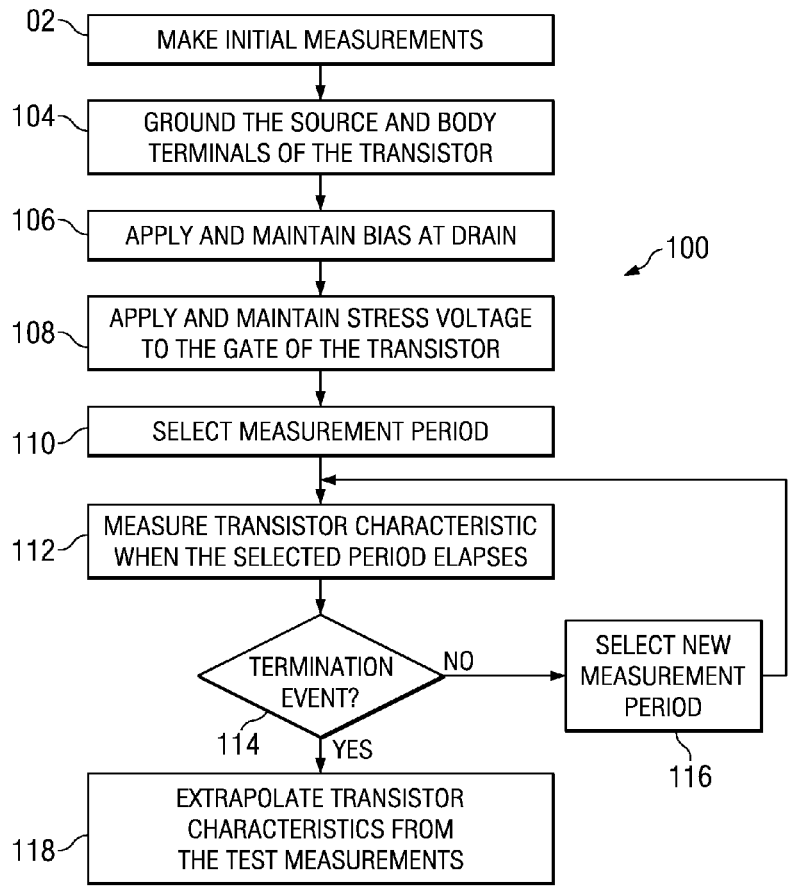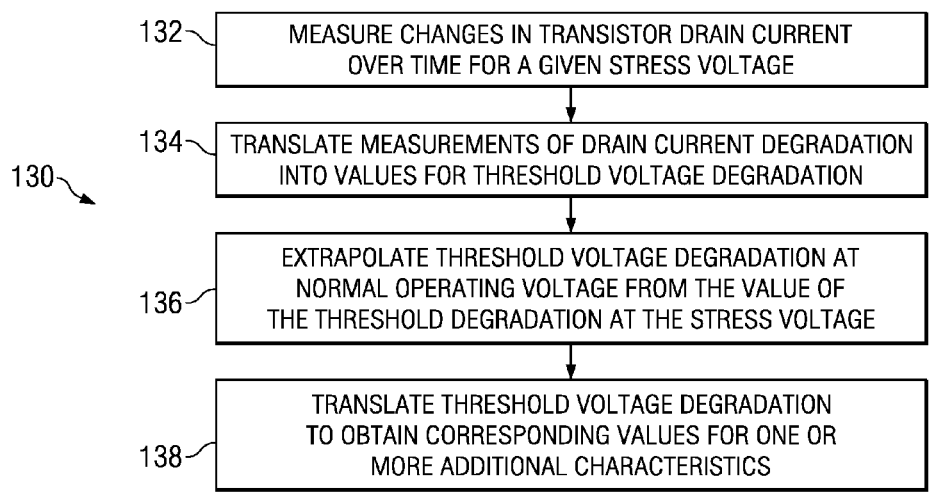

SYSTEM AND METHOD FOR ACCURATE NEGATIVE BIAS TEMPERATURE INSTABILITY CHARACTERIZATION

TECHNICAL FIELD

The present invention relates generally to electrical circuits, and more particularly to systems and methods for characterizing negative bias temperature instability of a transistor.

BACKGROUND OF THE INVENTION

Negative bias temperature instability is the tendency of a p-type metal oxide semiconductor (PMOS) transistor to degrade in performance when its gate terminal is biased negatively relative to the remaining terminals of the transistor over time. Negative bias temperature instability can increase the required threshold voltage of the transistor gate and decrease the drive current of the transistor. As a result, this instability has become one of the dominant reliability concerns in advanced complementary metal oxide semiconductor (CMOS) processes. Characterizing the effects of negative bias temperature instability on a given model of transistor is thus important in predicting an operational lifetime for the transistor and the products in which it is utilized.

One methodology for characterizing a negative bias temperature instability associated with a transistor includes connecting the source, drain, and body terminals of the transistor to ground. A stress voltage exceeding the normal operating voltage (in magnitude) of the transistor is then applied to the gate terminal of the transistor for a desired period. The stress voltage is removed from the gate terminal after a desired period. To measure the effects of the applied stress, a bias voltage (typically the operating voltage) is applied to the drain terminal and the current produced across the transistor by the bias voltage is measured. The bias voltage is then removed and the stress is reapplied. This cycle repeats until a desired number of cycles are completed.

A problem associated with the described methodology is that during measurements, the stress voltage to the gate is discontinued for a short time for each drain current measurement. During this time, an annealing effect associated with the transistor produces a significant recovery in the characteristics of the transistor, effectively reversing the degradation by a small amount. This recovery provides a source of error in characterizing the instability produced in the transistor. Further, the length of the delay is not standard between various testing methods, making it difficult to compare results obtained by different methods.

SUMMARY OF THE INVENTION

In accordance with one aspect of the present invention, a method for characterizing the negative temperature bias instability of a transistor is provided. A bias voltage is maintained at a drain terminal of the transistor during a test period. A stress voltage is maintained at a gate terminal of the transistor during the test period, such that the stress voltage is applied concurrently with the bias voltage. At least one characteristic of the transistor is measured at periodic intervals during the stress period while maintaining the stress voltage at the gate terminal to determine a degradation of the at least one characteristic caused by the stress voltage until a termination event occurs.

In accordance with another aspect of the present invention, a system is provided for characterizing the negative temperature bias instability of a transistor. A first switch connects a gate terminal of the transistor to a first voltage source. A second switch connects a drain terminal of the transistor to a second voltage source. A measuring device measures at least one characteristic of transistor. A system control controls the first switch, the second switch, and the measuring device, the system control maintaining the second switch in a closed position for a testing period. The system control directs the measuring device to make periodic measurements of the current at the drain terminal during the testing period.

BRIEF DESCRIPTION OF THE DRAWINGS

The foregoing and other aspects of the present invention will become apparent to those skilled in the art to which the present invention relates upon reading the following description with reference to the accompanying drawings.

FIG. 3 illustrates a methodology for characterizing a bias temperature instability associated with a transistor.

FIG. 4 illustrates an exemplary methodology for characterizing a bias temperature instability associated with a transistor.

DETAILED DESCRIPTION

The present invention relates to systems and methods for characterizing the negative bias temperature instability of a transistor. In accordance with an aspect of the present invention, a bias voltage can be maintained at the drain terminal of the transistor during a test period. A relatively large, negative stress voltage is applied to the gate terminal of the transistor. The current across the transistor can be measured at the drain terminal at selected intervals during the test period with no interruption of the stress voltage on the gate terminal to characterize the instability introduced by the stress voltage. The effects of a normal operating voltage on the transistor can be extrapolated from the measurements taken under stress.

Figure 1:
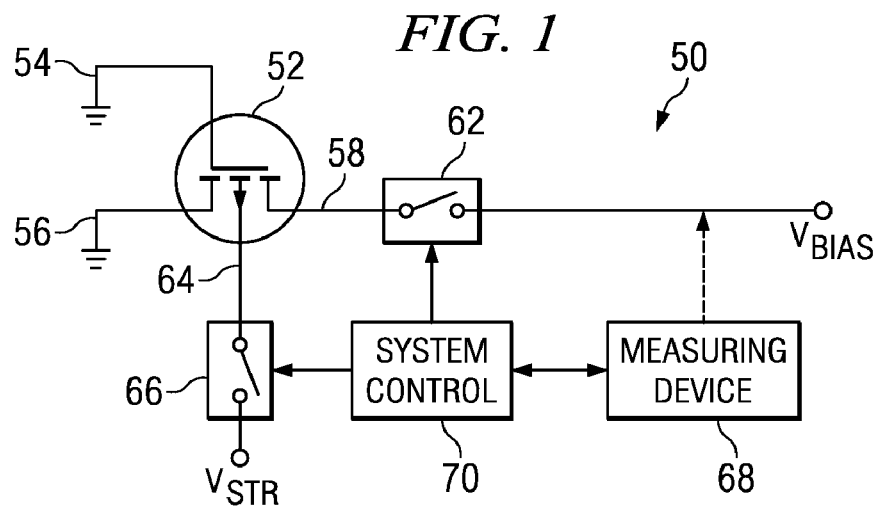
FIG. 1 illustrates an apparatus for characterizing a negative temperature bias associated with a transistor in accordance with an aspect of the present invention.

FIG. 1 illustrates an apparatus 50 for characterizing a negative temperature bias associated with a transistor 52 in accordance with an aspect of the present invention. The transistor 52 is connected into the apparatus such that its body terminal 54 and source terminal 56 are connected to ground. The drain terminal 58 of the transistor 52 is connected to a first voltage source providing a comparatively small bias voltage through a first switch 62. The gate terminal 64 of the transistor 52 is connected to a second voltage source providing a stress voltage through a second switch 66. A measuring device 68 can be connected in an appropriate manner between the drain terminal 58 and the first switch 62.

Prior to characterizing a transistor, initial measurements for various characteristics of the transistor can be taken. For example, initial values for the threshold voltage for the transistor gate, the current at the drain terminal generated by a bias voltage across the transistor during both linear and saturated operation, and the transconductance of the transistor. These initial values can be determined by any suitable means. The determined initial values are then recorded for analysis at a system control 70. It will be appreciated that the system control 70 can be implemented as dedicated hardware and/or as computer software executed by a general purpose processor.

Once the initial measurements have been made, the system control 70 can direct the first and second switches 62 and 66 to assume a closed position as to provide the stress voltage to the gate terminal 64 and the bias voltage to the drain terminal 58. The switches 62 and 66 remain closed for the duration of the testing, such that bias and stress voltages are applied to their respective terminals uniformly throughout the testing. The stress voltage can be selected to exceed a normal operating voltage associated with the gate terminal of the transistor 52 as to accelerate the degradation of the transistor. For example, the transistor 52 may have an operating voltage of one and one-half volts. The selected stress voltage can be around two or two and one-half volts as to increase the rate of degradation of the transistor 52. The rate of degradation under a normal operation can be determined from the rate of degradation under the stress voltage. The bias voltage is generally a relatively small voltage used to produce a small level of current at the drain terminal. For a sufficiently small bias voltage, it has been determined empirically that does not affect the rate of degradation of the transistor, allowing the voltage to be applied throughout the testing process.

Measurements of the transistor characteristic can be taken at desired intervals at the measurement device 68 to determine the degradation of the transistor characteristic over time. Since the bias voltage is constant for the duration of the characterization process, the decrease in measured drain current over time is indicative of instability produced in the transistor by the negative stress voltage. The degradation shown in transistor characteristics roughly follows a power law curve, and in an exemplary embodiment, the measurements can be taken at exponentially increasing intervals (e.g., a measurement can be taken at every power of ten) to more efficiently illustrate the degradation of the transistor. An advantage of the illustrated apparatus is its avoidance of the annealing effect associated with the testing process. Since the stress voltage is maintained throughout the testing process, the annealing effect is eliminated.

The transistor characteristic measurements can be provided to the system control 70 for analysis. The system control 70 can determine the degradation of the characteristic over time under the stress voltage and determine from this how the transistor would degrade at a normal operating gate voltage. For example, expected rates of degradation during normal operation can be determined for a threshold voltage associated with the gate terminal, a transconductance of the transistor, a mobility of the transistor, and the drain current produced during both linear and saturated operation. This can be accomplished, for example, by translating the degradation in the characteristic into an expected degradation in the gate threshold voltage for each stress voltage, and an expected gate threshold voltage degradation values for a standard voltage can be extrapolated from these measurements according to a power law relationship between the stress voltage and the threshold voltage degradation. Other characteristics at a normal operating voltage can be determined according to their relationship to the determined threshold voltage.

Figure 2:
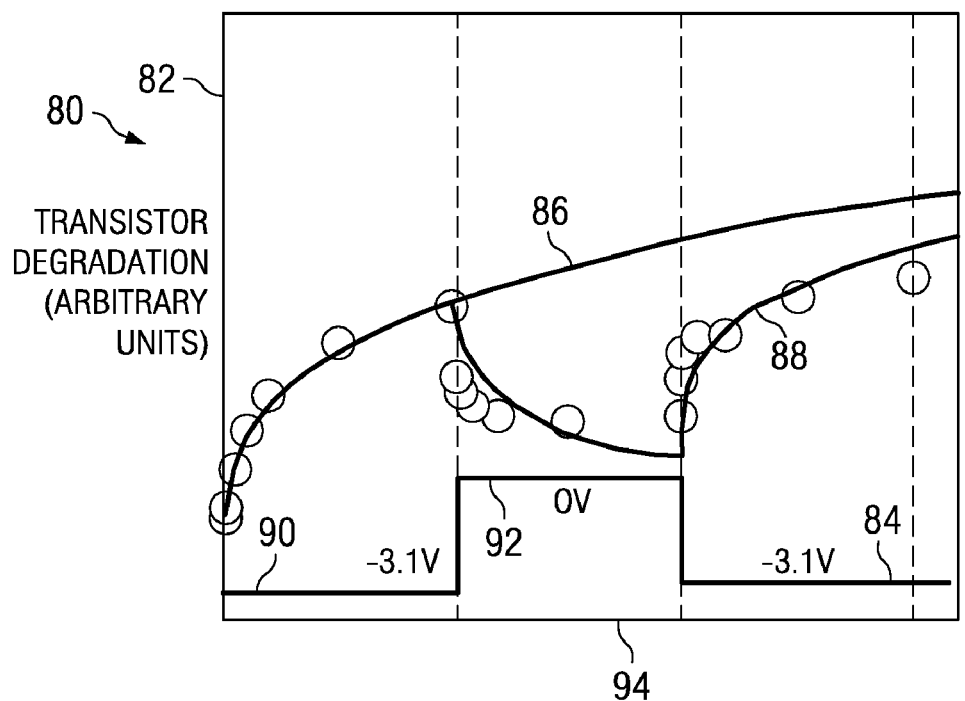
FIG. 2 is a line graph illustrating the annealing effect associated with negative temperature bias instability.

FIG. 2 is a line graph 80 illustrating the annealing effect associated with negative temperature bias instability. The horizontal axis 82 of the graph represents time within a testing period. The vertical axis 84 represents a degree of degradation in each transistor, in arbitrary units. A first transistor, represented by a first line 86, is subjected to a negative stress voltage of 3.1 volts at its gate terminal for the duration of the testing period. A second transistor, represented by a second line 88, is stressed with a negative stress voltage of 3.1 volts during a first stress portion 90 of the testing period. The stress is removed during a delay portion of the testing period 92, and reapplied during a second stress portion of the testing period 94, in which the negative stress voltage is reapplied.

The first transistor 86 illustrates a smooth degradation with a power law relationship over time, as would be expected for a transistor under constant stress. The second transistor 88 exhibits a similar degradation during the first stress period 90. Once the stress is removed in the delay period 92, however, the second transistor 86 experiences an annealing, or recovery effect, and the degradation is reduced. The degradation returns when the stress is reapplied to the second transistor 88 during the second stress period 94, but the level of degradation of the second transistor 88 remains lower than the level of degradation in the first transistor 86. Accordingly, the degradation experienced by the second transistor 88 will not be fully representative of a transistor under constant stress. Therefore, a lifetime determination based on the degradation of the second transistor 88 would be inaccurate.

Referring now to FIGS. 3 and 4, there is illustrated a methodology 100 in accordance with an aspect of the present invention. While, for purposes of simplicity of explanation, a methodology is shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

FIG. 3 illustrates a methodology 100 for characterizing a bias temperature instability associated with a transistor. The methodology 100 begins at 102 where initial measurements of the transistor are taken. The initial measurements characterize the device prior to the application of a stress at the gate terminal. For example, the drain current and threshold voltage of the device can be measured during linear and saturated modes of operation of the transistor. Similarly, other parameters, such as the transconductance and mobility of the transistor can be measured or determined from other measured data. At 104, the source and body terminals of the transistor are connected to ground. At 106, a small bias voltage is applied to the drain terminal of the transistor. In accordance with an aspect of the present invention, the bias voltage will be maintained at the drain terminal through the testing period. The bias current can be kept small, such that the transistor is operating in a linear mode. A stress voltage is then applied to the gate terminal of the transistor at 108. It will be appreciated that the stress voltage can significantly exceed the expected operating voltage of the transistor.

At 110, a first measurement period is selected for the test. The first measurement period controls the time until a first measurement is made in the system. In one example, the first measurement can be made one second after the stress voltage is applied to the gate terminal. At 112, a measurement of a transistor characteristic, such as the current at the drain terminal of the transistor, is made at the end of the selected time period with no interruption of the stress voltage on the gate terminal. It is then determined if a termination event has occurred at 114. Available termination events will vary with the application, but they can include the passage of a predetermined period of time, a threshold value for the measured characteristic, or the complete failure of the transistor.

If it is determined that no termination event has occurred (N), the methodology continues to 116, where a new measurement period is selected. The selection of measurement periods will vary with the desired application. In an exemplary embodiment, the various measurement periods are selected as to produce a base ten exponential progression of measurement periods. For example, a first period can comprise one second, a second period can comprise nine seconds, a third period can comprise ninety seconds, and so on, such that each measurement is taken at a time corresponding to a power of ten. Once the period is selected, the methodology returns to 112 to take a measurement at the end of the selected period.

If it is determined that a termination event has occurred (Y), the methodology advances to 118, where the expected characteristics of the transistor under normal operation are determined from the measured degradation in the measured characteristic under constant stress. For example, a measured degradation in the drain current in linear mode under the stress voltage can be used to derive the expected rate of degradation of the linear drain current under normal operation. In an exemplary implementation, a transistor can be tested at several stress levels. The amount of time necessary to degrade the transistor to a given level of drain current at each stress level can be plotted as lifetime values, and the lifetime of the transistor at an operating voltage can be extrapolated from the plot. This is facilitated by the fact that the lifetime of a transistor decreases according to a exponential function of the stress voltage utilized.

In another exemplary embodiment, the expected rate of degradation in the threshold voltage for the transistor and the expected rate of degradation in drain current associated with operation in saturation can be determined in from a measured degradation in drain current during linear operation of the transistor. It will be appreciated that, in accordance with the present invention, the linear drain current can be measured during testing without interrupting the stress voltage at the drain terminal. Accordingly, instead of interrupting the stress voltage to measure the threshold voltage and drain current at saturation, the characteristics can be derived from the measured degradation in the linear mode drain current without interruption of the gate voltage. The relationship between the degradation in the linear drain current and the degradation in the threshold voltage can be expressed as follows:

$$\frac{\delta I_{DLIN}}{I_{DLIN}} \approx \frac{-\delta V_T}{V_G - V_T} \qquad \text{Eq. 1}$$

where $\delta I_{DLIN}$ is the change in the linear drain current during stress, $I_{DLIN}$ is the initial linear drain current, $\delta V_T$ is the expected change in the threshold voltage, $V_T$ is the initial threshold voltage, and $V_G$ is stress voltage applied to the transistor gate.

The relationship between the degradation of the linear drain current and the expected degradation of the drain current at saturation can be expressed as follows:

$$\frac{\delta I_{DSAT}}{I_{DSAT}} \approx \theta \frac{-\delta V_T}{V_G - V_T} \approx \theta \frac{\delta I_{DLIN}}{I_{DLIN}} \qquad \text{Eq. 2}$$

where $\delta I_{DSAT}$ is the expected change in the drain current at saturation during stress, $I_{DSAT}$ is the initial drain current at saturation, $\delta I_{DLIN}$ is the change in the linear drain current during stress, $I_{DLIN}$ is the initial linear drain current, $\delta V_T$ is the expected change in the threshold voltage, $V_T$ is the initial threshold voltage, $V_G$ is stress voltage applied to the transistor gate, and $\theta$ is a function of the transistor channel length that typically ranges between one and two.

FIG. 4 illustrates an exemplary methodology 130 for characterizing a bias temperature instability associated with a transistor. The methodology begins at 132, where the degradation in the drain current during linear operation is measured as a function of time for a stress voltage. This can be accomplished by maintaining a bias voltage at the drain terminal of the transistor and a stress voltage is maintained at the gate terminal of the transistor during a test period. The current at the drain terminal is measured at periodic intervals during the stress period to determine a degradation of the drain current at various points in time. For example, measurements can be taken at a time associated with each power of ten (e.g., one second, ten second, one-hundred second, etc.) to better illustrate of the power law degradation of the transistor over time.

Once these values have been determined, the methodology advances to 134, where the drain current degradation measurements are translated to threshold voltage degradation measurements. A corresponding threshold voltage degradation can be calculated from a drain current degradation measured for a given stress voltage and time interval according to the following relationship:

$$\frac{\delta I_{DLIN}}{I_{DLIN}} \approx \frac{-\delta V_T}{V_G - V_T} \qquad \text{Eq. 3}$$

where $\delta I_{DLIN}$ is the change in the linear drain over a given time interval for a given stress voltage, $I_{DLIN}$ is the initial linear drain current, $\delta V_T$ is the expected change in the threshold voltage over a given time interval for a given stress voltage, $V_T$ is the initial threshold voltage, and $V_G$ is stress voltage applied to the transistor gate.

At 136, the expected threshold degradation at other stress voltages is extrapolated from the calculated values at the original stress voltage. The expected degradation for a given transistor can be expressed as a function of stress voltage and time as follows $$\Delta V_T = Ce^{-E_A/kT} e^{\beta V_G} t^n;$$ Eq. 4 where C is a transistor dependent constant, β is a voltage acceleration constant associated with the transistor, $E_A$ is an activation energy associated with the transistor, k is the Boltzmann constant, T is the absolute temperature, $V_G$ is the voltage applied at the gate terminal, t is the time the voltage is applied, n is a time exponent associated with the transistor, and $\Delta V_T$ is the change in the threshold voltage.

Figure 5:
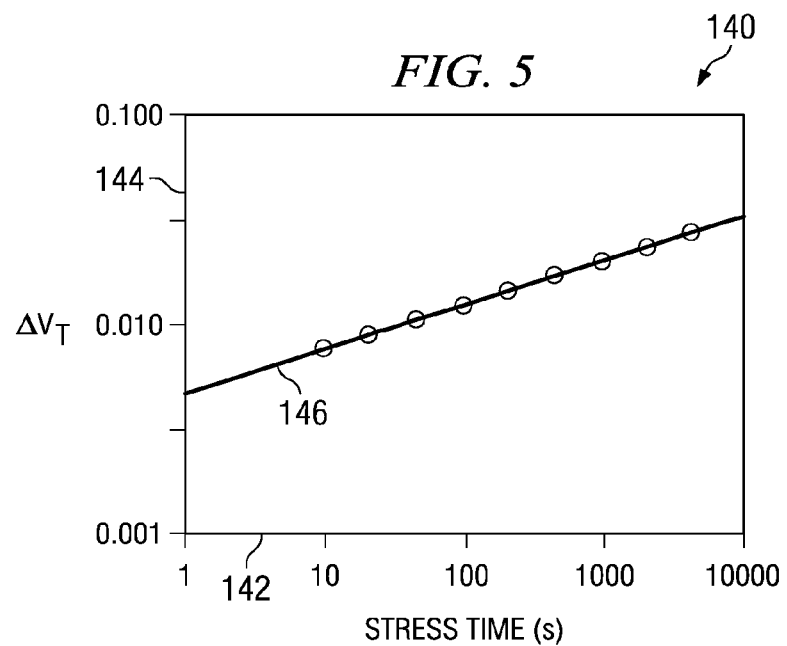
FIG. 5 illustrates a line graph of a number of threshold voltage degradation values plotted on a logarithmic scale.

The power law relationship between the threshold voltage degradation and the stress time for a given stress voltage is illustrated in FIG. 5. FIG. 5 illustrates a line graph 140 of a number of threshold voltage degradation values plotted on a logarithmic scale. The horizontal axis 142 represents the time for which the transistor has been stressed. The vertical axis 144 represents the degradation (e.g., increase) in the threshold voltage of the transistor. It will be appreciated that measurements of the degradation of the transistor over time form a line 146 having a slope equal to a time exponent associated with the transistor.

Returning to the illustrated methodology of FIG. 4, it is possible to extrapolate the degradation in the threshold voltage at a normal gate voltage from the calculated degradation at stress voltage using the power law relationship. Once this value is obtained, the methodology advances to 138, where the extrapolated value for the threshold voltage is used to determine one or more additional parameters for the transistor. For example, the useful lifetime of the transistor can be obtained by selecting an acceptable level of threshold voltage degradation and determining the time it will take the transistor to degrade to that level for a given operating voltage. Similarly, a relationship between the threshold voltage degradation and a degradation in the drain current over a period of time during saturated operation of the transistor can be expressed as follows:

$$\frac{\delta I_{DSAT}}{I_{DSAT}} \approx \theta \frac{-\delta V_T}{V_G - V_T}$$ Eq. 5 where $\delta I_{DSAT}$ is the expected change in the drain current over an interval at saturation for a gate voltage $V_G$, $I_{DSAT}$ is the initial drain current at saturation, $\delta V_T$ is the expected change in the threshold voltage over the same interval, $V_T$ is the initial threshold voltage, and θ is a function of the transistor channel length that typically ranges between one and two.

Other such relationships will be appreciated by those skilled in the art. Once the appropriate characteristics have been determined, the methodology 130 terminates.

Figure 6:
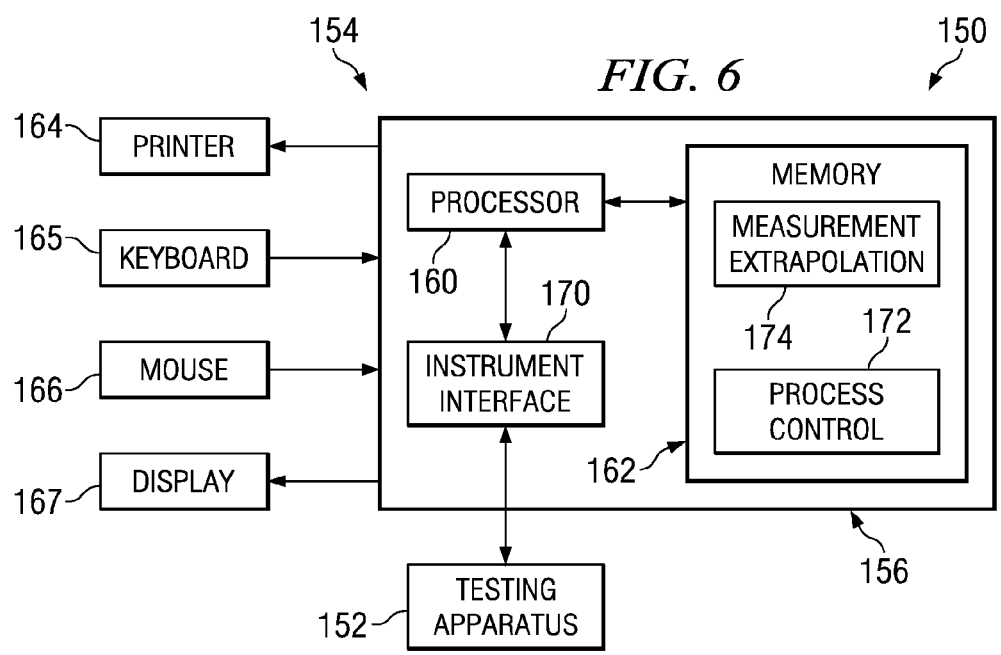
FIG. 6 illustrates an exemplary system characterizing a negative temperature bias associated with a transistor in accordance with an aspect of the present invention.

FIG. 6 illustrates an exemplary system 150 for characterizing negative bias temperature instability in a transistor in accordance with the present invention. The system includes a testing apparatus 152 that includes the physical apparatus for applying stress voltages and taking drain current measurements from the transistor. Accordingly, the testing apparatus can comprise one or more voltage sources, switches, and measurement devices (e.g., ammeters).

In the illustrated implementation, the system control 154 comprises a computer 156 which has a processor 160 and memory 162. The computer 156 can be operatively connected to one or more input and output devices to allow a human operator to interact with the system, such as a printer 164, a keyboard 165, a mouse 166 and a display 167. The computer 156 can be implemented as any suitable general purpose computer.

The processor 160 is operatively coupled to the testing apparatus 152 via an instrument interface 170. The instrument interface 170 include one or more components for interpreting data from the testing apparatus 152 and generating electrical commands to the various components of the testing apparatus (e.g., ammeter, switches). The processor 160 provides appropriate commands to the instrument interface 170 according to a process control program 172 stored in the memory. As measurement data is received at the computer 156 it is analyzed at the processor 160 according to a measurement translation program 174 stored in memory. The measurement translation program 174 provides the functionality for converting the measured characteristics from the testing apparatus 152 into lifetime predictions for one or more characteristics of the transistor. For example, the testing can be performed for one or more stress voltages, and a degradation in the drain current can be measured for each. The degradation in the drain current can be translated into an expected degradation in the gate threshold voltage for each stress voltage, and an expected gate threshold voltage degradation values for a standard voltage can be extrapolated from these measurements according to a power law relationship between the stress voltage and the threshold voltage degradation. Other characteristics at a normal operating voltage can be determined according to their relationship to the determined threshold voltage.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for characterizing the negative temperature bias instability of a transistor, comprising:
   a first switch that connects a gate terminal of the transistor to a first voltage source;
   a second switch that connects a drain terminal of the transistor to a second voltage source;
   a measuring device that measures at least one characteristic of transistor; and
   a system control that controls the first switch, the second switch, and the measuring device, the system control maintaining the second switch in a closed position for a testing period and directing the measuring device to make periodic measurements of the at least one transistor characteristic during the testing period.

2. The system of claim 1, the first voltage source providing a first voltage that is greater than a normal operating voltage associated with the gate terminal of the transistor.

3. The system of claim 1, the system control maintaining the first switch in a closed position for the testing period as to substantially eliminate annealing effects within the transistor during the desired testing period.

4. The system of claim 1, the periodic measurements being separated by exponentially increasing intervals.

5. The system of claim 1, the system control determining the rate of degradation associated with a normal operating voltage at the gate terminal for the at least one characteristic of the transistor from the periodic measurements of the at least one characteristic.

6. A system for characterizing the negative temperature bias instability of a transistor, comprising:
   means for maintaining a uniform bias voltage at a drain terminal of the transistor for a testing period during said characterization of the negative temperature bias instability;
   means for maintaining a uniform stress voltage at a gate terminal of the transistor for the testing period; and
   means for measuring a degradation in a characteristic of the transistor during the testing period; wherein the transistor is operating in a linear mode under stress conditions.

7. The system of claim 6, further comprising means for controlling at least one of the means for maintaining a stress voltage, the means for maintaining a bias voltage, and the means for measuring.

8. The system of claim 7, the means for controlling comprising means for extrapolating at least one desired characteristic of the transistor associated with a normal operating voltage from the measured degradation in characteristic of the transistor.

* * * * *